(12) United States Patent  
Yamashita (10) Patent No.: US 6,982,216 B1  
(45) Date of Patent: Jan. 3, 2006

(54) MOSFET HAVING REDUCED PARASITIC RESISTANCE AND METHOD OF FORMING SAME

(75) Inventor: Tenko Yamashita, Somers, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 10/976,098

(22) Filed: Oct. 27, 2004

(51) Int. Cl.  
*H01L 21/425* (2006.01)

(52) U.S. Cl. ............ 438/525; 438/197; 438/286; 438/302; 438/303; 438/514; 438/527

(58) Field of Classification Search ........ 438/197, 438/286, 302, 303, 514, 525, 527  
See application file for complete search history.

(56) References Cited

U.S. PATENT DOCUMENTS

| | | | |
|---|---|---|---|
| 5,476,803 A | 12/1995 | Liu | 437/44 |
| 5,923,979 A | 7/1999 | Pitzer et al. | 438/268 |
| 6,114,726 A | 9/2000 | Barkhordarian | 257/341 |
| 6,133,106 A | 10/2000 | Evans et al. | 438/299 |
| 6,168,999 B1 * | 1/2001 | Xiang et al. | 438/286 |
| 6,200,863 B1 * | 3/2001 | Xiang et al. | 438/286 |
| 6,277,695 B1 | 8/2001 | Williams et al. | 438/268 |
| 6,406,964 B1 * | 6/2002 | Wristers et al. | 438/305 |
| 6,534,836 B1 | 3/2003 | Osanai | 257/401 |
| 6,730,552 B1 | 5/2004 | Abadeer et al. | 438/197 |
| 6,746,924 B1 | 6/2004 | Lee et al. | 438/286 |

* cited by examiner

*Primary Examiner*—Christian D. Wilson  
*Assistant Examiner*—Douglas M. Menz  
(74) *Attorney, Agent, or Firm*—Mayer Fortkort & Williams PC; Stuart H. Mayer, Esq.; Karin L. Williams, Esq.

(57) ABSTRACT

A method is provided for fabricating a MOSFET device. The method begins by forming a semiconductor device having a substrate on which a gate conductor having sidewalls separates a source region and a drain region. An oxide layer is formed over the gate sidewalls and a portion of the substrate. Ions of a first conductivity are implanted into the source and the drain regions to define source and drain extensions that respectively extend in part under the gate conductor. A nitride layer is formed over the oxide layer that extends over the portion of the substrate. An angled ion implant is performed during which the gate conductor shields a portion of the nitride layer over at least a portion of the drain region from damage by the angled ion implant. The angled ion implant selectively damages portions of the nitride layer in which ions are implanted to form damaged portions of the nitride layer. The damaged portions of the nitride layer are removed while leaving undamaged portions of the nitride layer as a nitride mask to protect at least a portion of the source and drain extensions from a subsequent dopant implant. Ions of the first conductivity type are implanted into the source region and the drain region while using the undamaged portions of the nitride layer as a mask to form deep source and deep drain regions, respectively. A conductive layer is formed over exposed portions of the deep source region and the deep drain region such that a lateral distance between an edge of the conductive layer over the source region and an end of the source extension under the gate conductor is less than a lateral distance between an edge of the conductive layer over the drain region and an end of the drain extension under the gate conductor.

11 Claims, 10 Drawing Sheets

ASSYMETRIC SOURCE / DRAIN IS FORMED

FIG. 10

MOSFET HAVING REDUCED PARASITIC RESISTANCE AND METHOD OF FORMING SAME

FIELD OF THE INVENTION

The present invention relates generally to semiconductor devices, and more particularly to a MOSFET device in which the parasitic resistance is reduced.

BACKGROUND OF THE INVENTION

Higher circuit density and faster switching speed have been a major focus of recent developments in semiconductor technology. There are two related factors that limit the switching speed of semiconductor devices. First, in a bipolar transistor, for example, is the parasitic resistance between the base contact and the active area of the transistor. Secondly is the parasitic capacitance between the base region and the collector region. Each time the transistor switches, the base current charges or discharges the parasitic capacitance. The base current is further impeded by the parasitic base resistance. The speed of the semiconductor device is increased by reducing the product of the parasitic base resistance and the parasitic capacitance.

Metal Oxide Semiconductor (MOS) devices are also susceptible to parasitic capacitances and parasitic resistances. Asymmetric MOSFET devices are known MOSFET devices for reducing parasitic capacitances. In such MOSFETs the source and drain regions are not symmetrically doped because of different implant dosages or because of asymmetric source and drain extension implant relative to the gate channel conductor. For example, U.S. Pat. No. 6,746,924 discloses a method of forming an asymmetric extension MOSFET using a drain side spacer which allows a choice of source and drain sides for each individual MOSFET device and also allows an independent design or tuning of the source and drain extension implant dose as well as its spacing from the gate. The source and drain extensions are asymmetric in the sense that the extension on the source side overlaps with the gate by a distance that is different from the overlap with the gate on the drain side. In this reference a photoresist mask is formed over at least a portion of each drain region, followed by an angled ion implant during which the photoresist mask and the gate conductor shield the nitride layer over at least a portion of the drain region and at least one sidewall of the gate conductor from damage by the angled ion implant which selectively damages portions of the nitride layer unprotected by the photoresist mask and the gate conductor. Then damaged portions of the nitride layer are removed while leaving undamaged portions of the nitride layer as a nitride mask to protect at least a portion of each drain region and at least one gate sidewall from a subsequent dopant implant, which is performed into the source regions and the drain regions while using the undamaged portions of the nitride layer as a mask to form the asymmetric extension MOSFET device.

While the MOSFET device shown in the aforementioned reference may reduce the parasitic capacitance, there remains a need to provide a MOSFET device in which the parasitic resistances are reduced.

SUMMARY OF THE INVENTION

In accordance with the present invention, a method is provided for fabricating a MOSFET device. The method begins by forming a semiconductor device having a substrate on which a gate conductor having sidewalls separates a source region and a drain region. An oxide layer is formed over the gate sidewalls and a portion of the substrate. Ions of a first conductivity are implanted into the source and the drain regions to define source and drain extensions that respectively extend in part under the gate conductor. A nitride layer is formed over the oxide layer that extends over the portion of the substrate. An angled ion implant is performed during which the gate conductor shields a portion of the nitride layer over at least a portion of the drain region from damage by the angled ion implant. The angled ion implant selectively damages portions of the nitride layer in which ions are implanted to form damaged portions of the nitride layer. The damaged portions of the nitride layer are removed while leaving undamaged portions of the nitride layer as a nitride mask to protect at least a portion of the source and drain extensions from a subsequent dopant implant. Ions of the first conductivity type are implanted into the source region and the drain region while using the undamaged portions of the nitride layer as a mask to form deep source and deep drain regions, respectively. A conductive layer is formed over exposed portions of the deep source region and the deep drain region such that a lateral distance between an edge of the conductive layer over the source region and an end of the source extension under the gate conductor is less than a lateral distance between an edge of the conductive layer over the drain region and an end of the drain extension under the gate conductor.

In accordance with one aspect of the invention, subsequent to the step of implanting ions to form the deep source and drain regions, an annealing step is performed so that portions of the source and the drain extensions extend under the oxide layer In accordance with another aspect of the invention, the portions of the source and the drain extensions extending under the oxide layer are substantially equal in width.

In accordance with another aspect of the invention, the gate conductor comprises polysilicon.

In accordance with another aspect of the invention, the step of removing the damaged portions of the nitride layer is performed with a wet etch process.

In accordance with another aspect of the invention, the angled ion implant step is performed with silicon ions.

In accordance with another aspect of the invention, the angled ion implant step is performed with germanium ions.

In accordance with another aspect of the invention, the substrate comprises a silicon substrate.

In accordance with another aspect of the invention, the substrate comprises a silicon-on-insolator (SOI) substrate.

In accordance with another aspect of the invention, the step of implanting ions of a first conductivity into the source and the drain regions comprises a halo implantation step.

DETAILED DESCRIPTION

In MOSFET devices there are three primary contributions to the parasitic resistance: the resistance of the silicide layer that contacts the source and drain, the resistance of the deep source and the deep drain regions, and the resistance of the source and drain extensions. MOSFET performance is more adversely affected by the parasitic resistance on the source side than on the drain side. The present invention provides a MOSFET structure in which the contributions to the parasitic resistance of the deep source region and the source extension are reduced. As detailed below, this result is achieved by narrowing the nitride mask on the source side relative to the drain side so that the deep source region and the silicide layer located above the deep source layer are closer to the channel than the deep drain region and the silicide layer located above the deep drain region. Moreover, if the substrate that is employed is a silicon-on-insulator substrate, since the source/channel is forward biased when the device is in operation, the forward junction leakage increases when the silicide is close to the junction. As a result, the floating body effect, which determines the leakage current arising from the source, drain and gate will be advantageously improved.

In the process fabrication steps set forth below, those of ordinary skill in the art will recognize that conventional processing techniques, including deposition or thermal oxidation and patterning by lithography and etching, may be used to form the inventive MOSFET structure.

Figure 1:
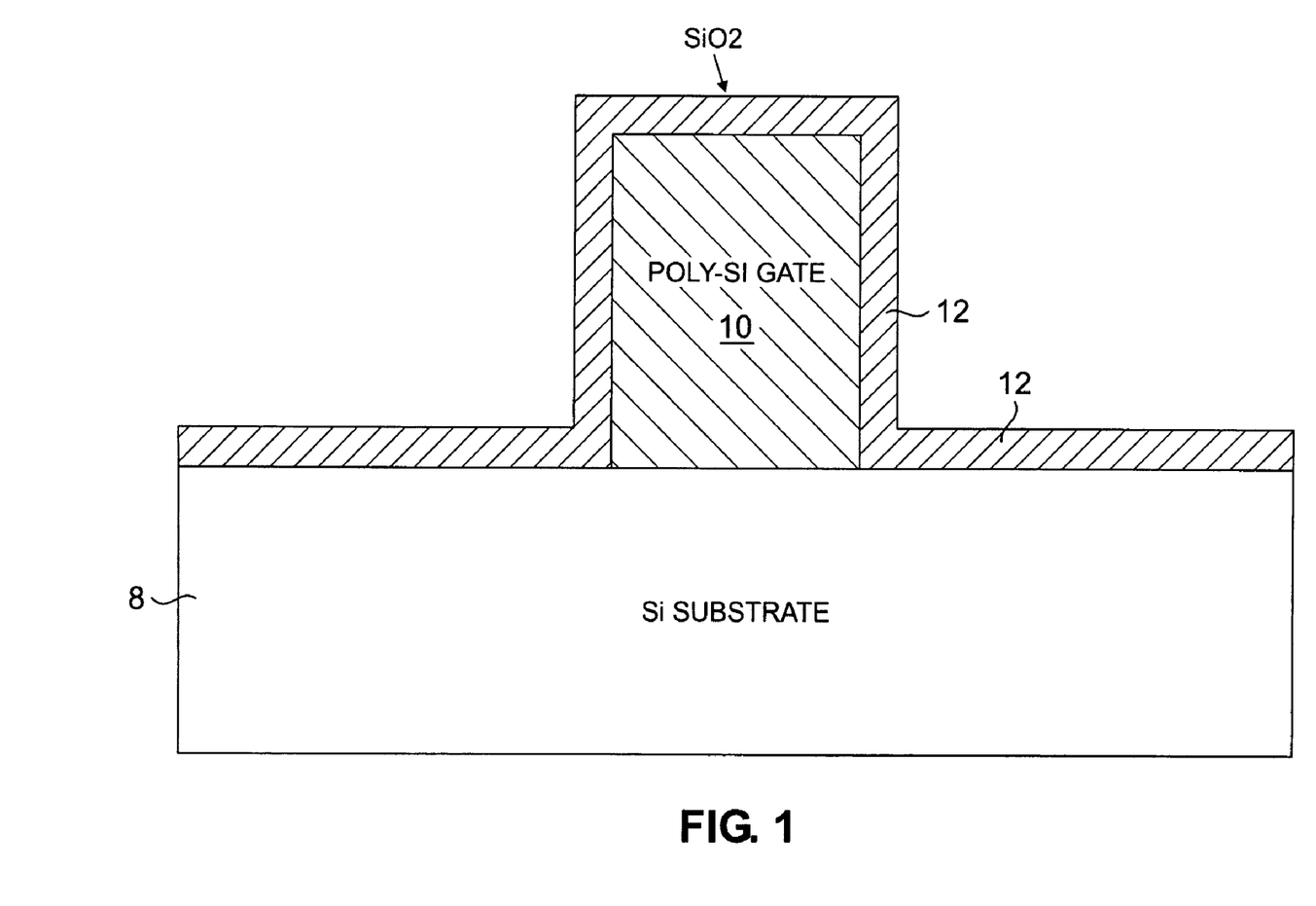
FIGS. 1–10 show an exemplary process flow for fabricating a MOSFET device in accordance with the present invention.
Figure 2:
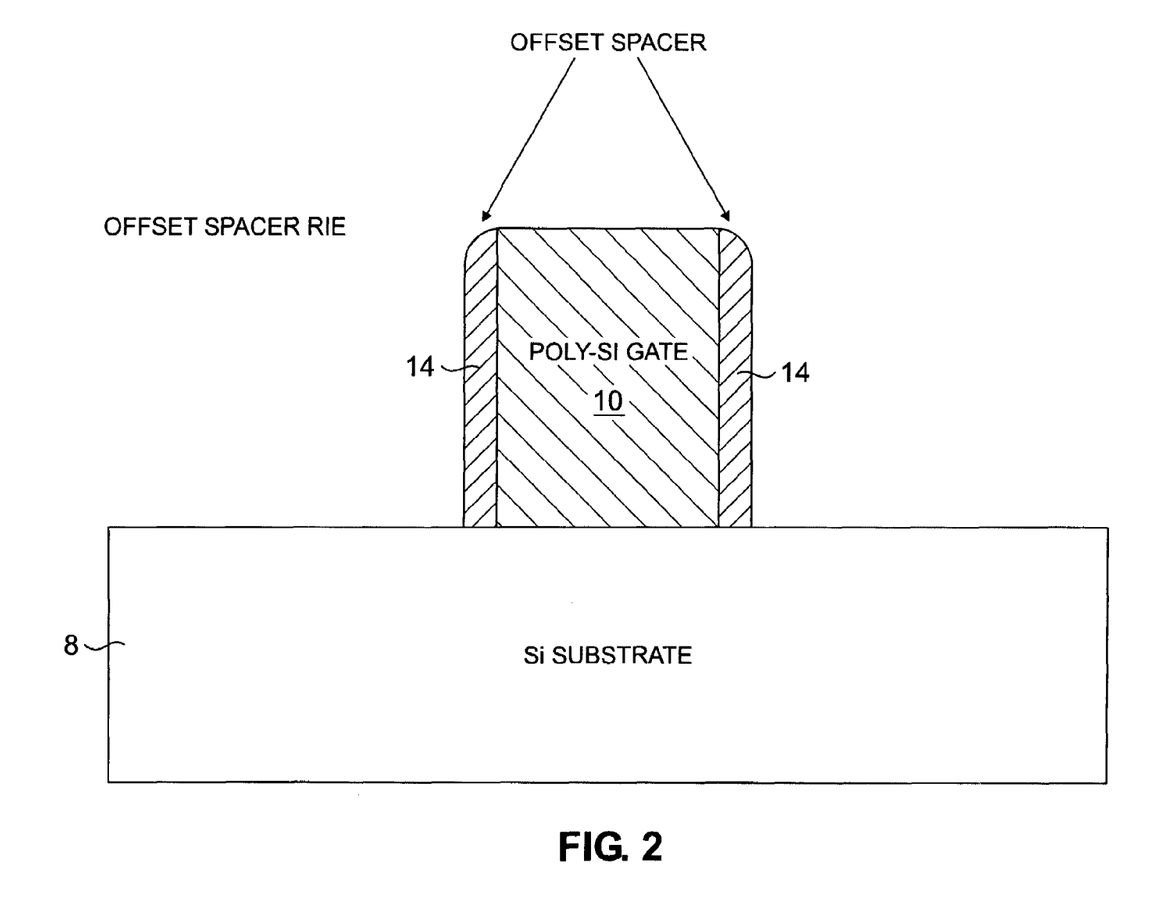
Figure 3:
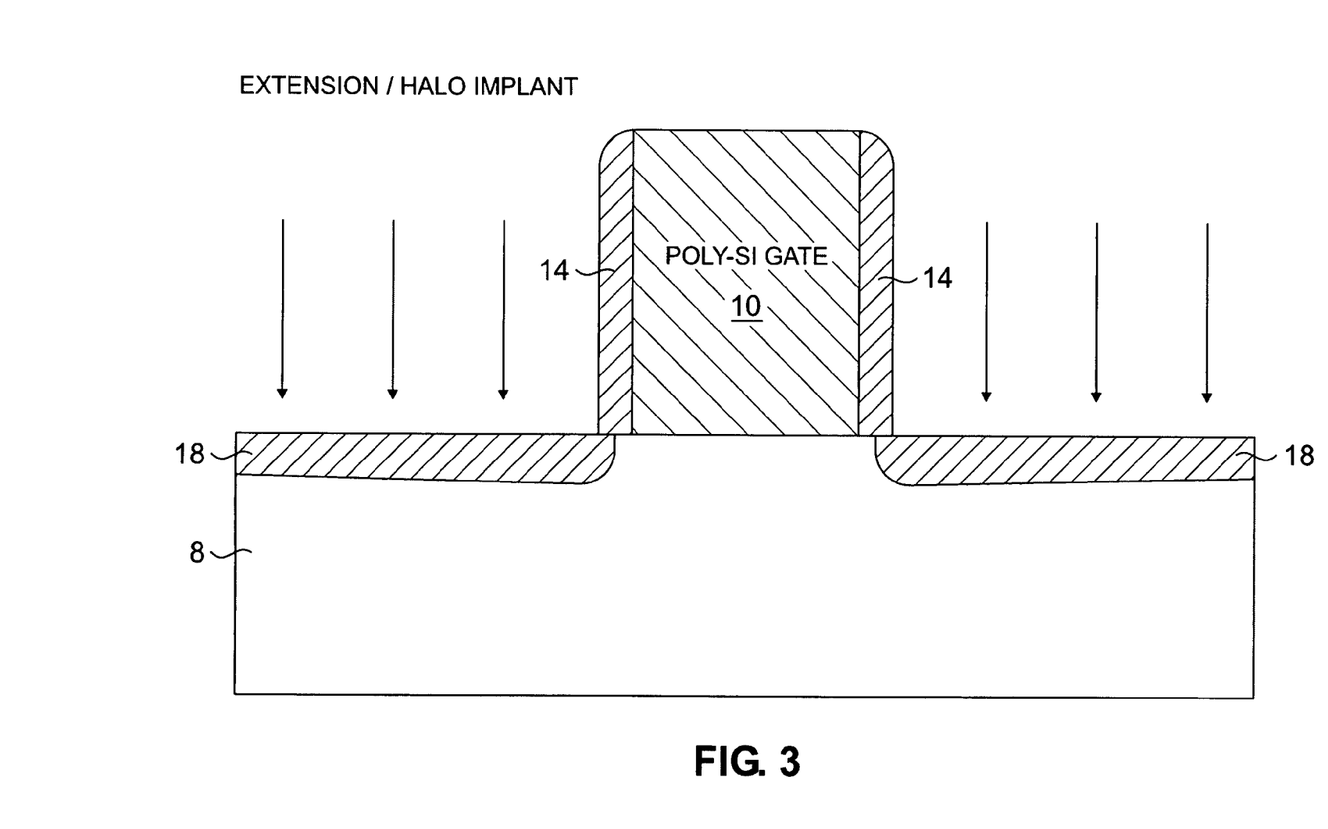

FIG. 1 illustrates a substrate 8, typically formed of silicon or silicon-on-insulator (SOI), on which a gate conductor 10 is formed, typically of polysilicon or other known materials. An oxide layer 12 is formed over the entire structure. In FIG. 2 the horizontal portions of oxide layer 12 are removed by a reactive ion etch (RIE) to from offset spacers 14 along the sidewalls of the gate conductor 10. Offset spacers 14 serve to increase the effective width of the channel in the resulting device. Next, in FIG. 3, N type impurity ions are implanted into the substrate 8 to form source and drain extensions 18. A halo implant is also performed, in which a second implant of the same polarity as the extensions 18 is used to increase the dopant concentration at the edge of the source and drain extensions 18 to thereby reduce the depletion region. As seen in FIG. 3, the halo implant ensures that the source and drain extensions 18 extend under a portion of the spacers 14 to better control the threshold $V_t$ of the transistor. That is, there is some degree of overlap between the extensions 18 and the offset spacers 14.

Figure 4:
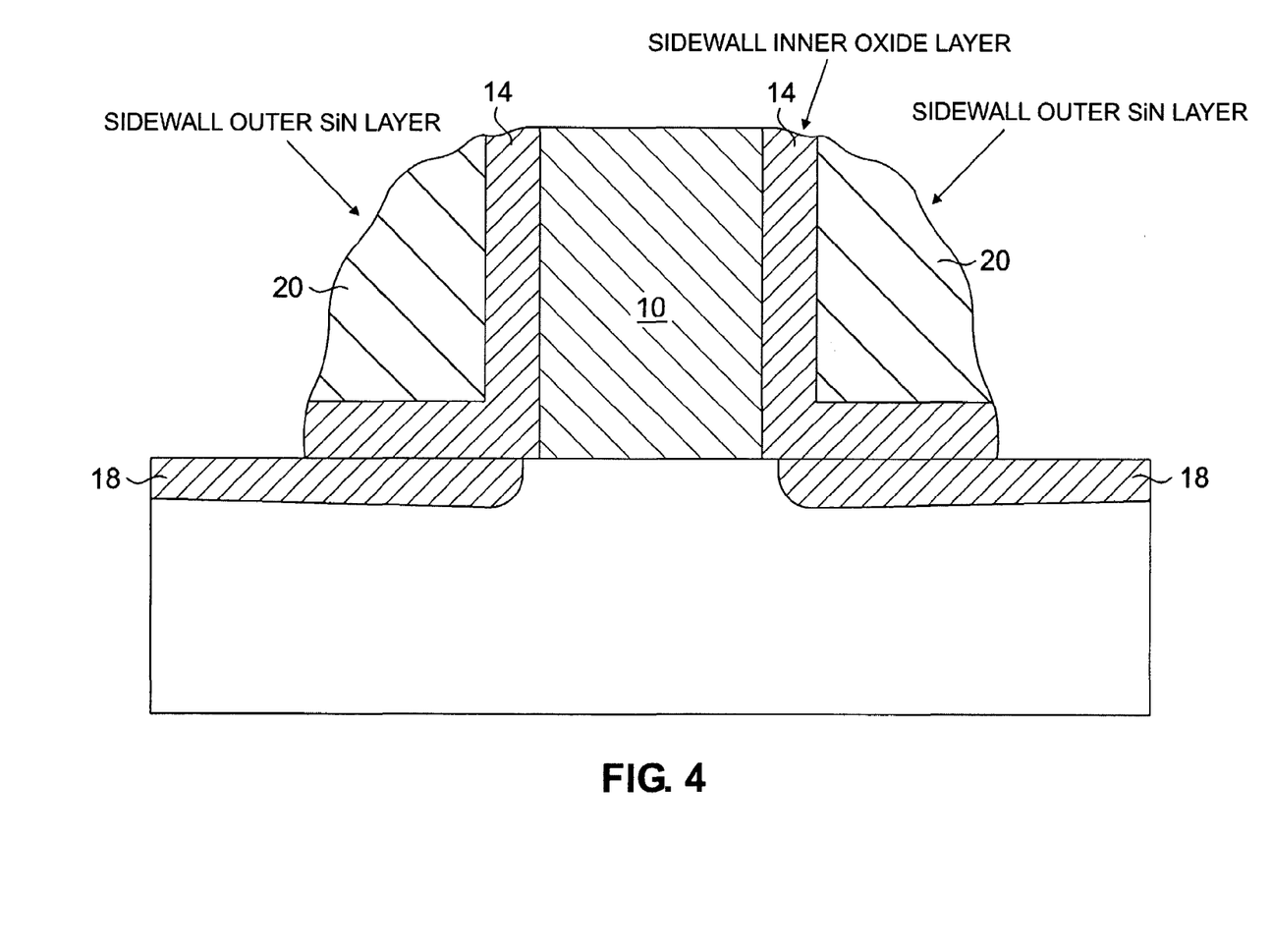
Figure 5:
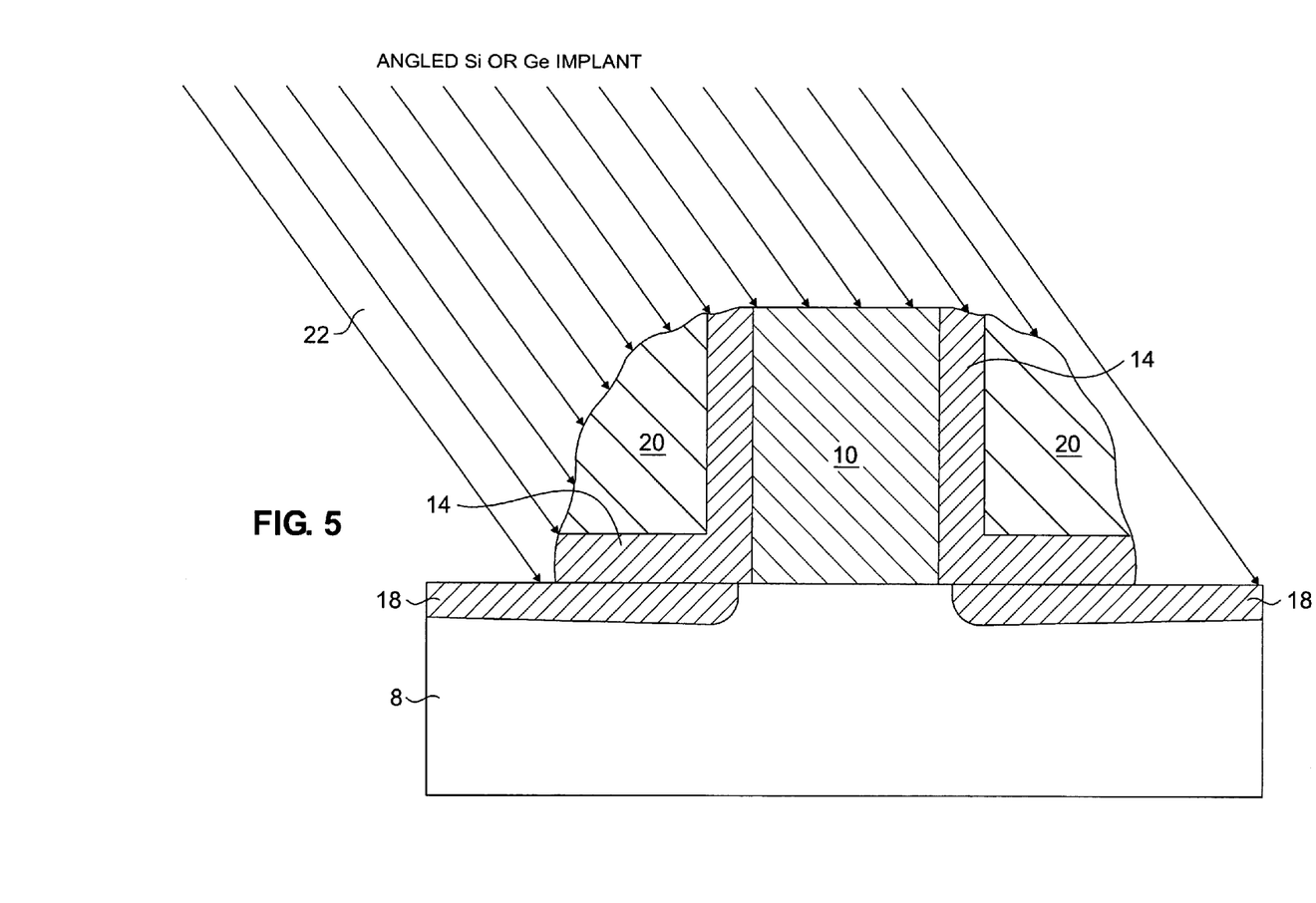
Figure 6:
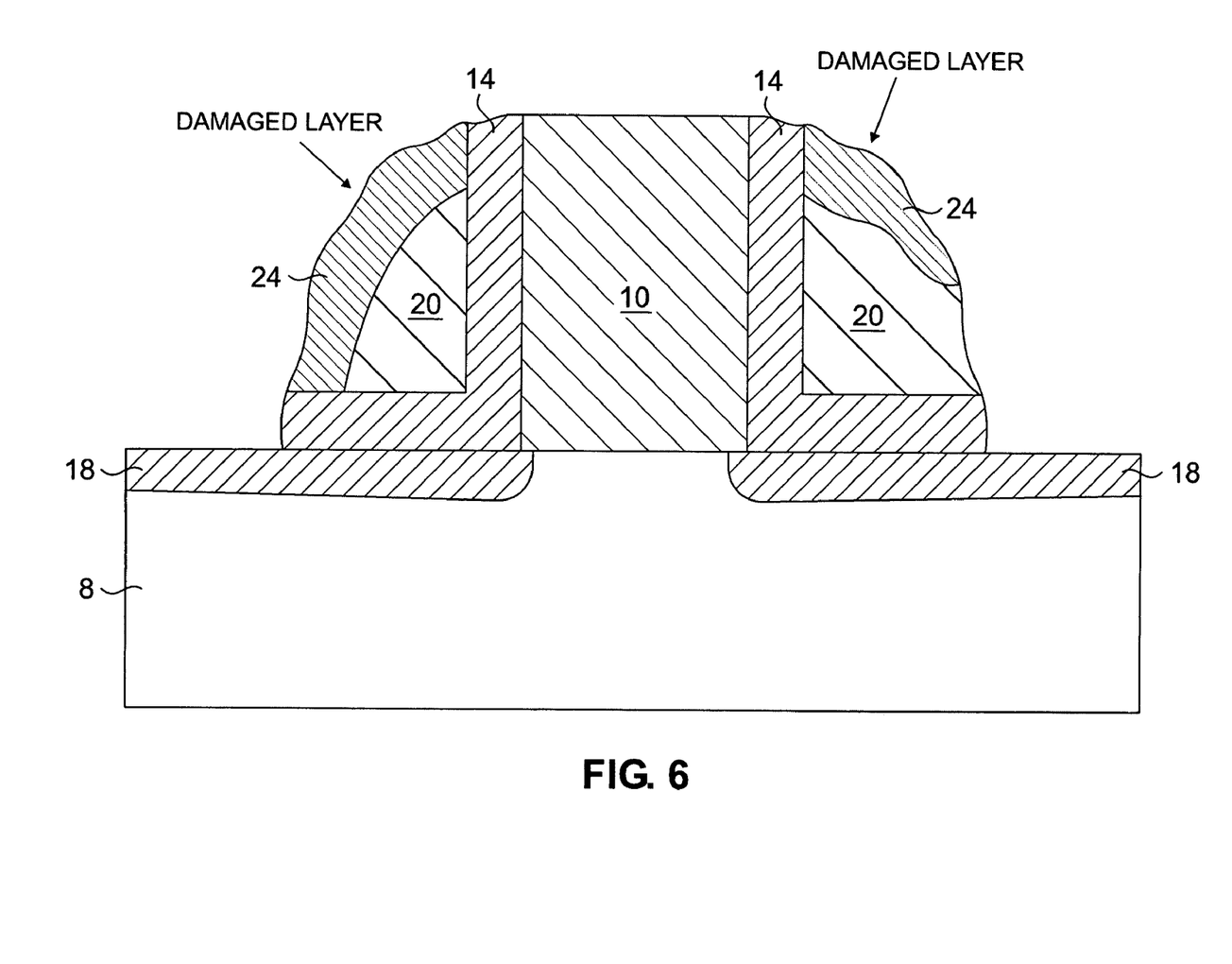
Figure 7:
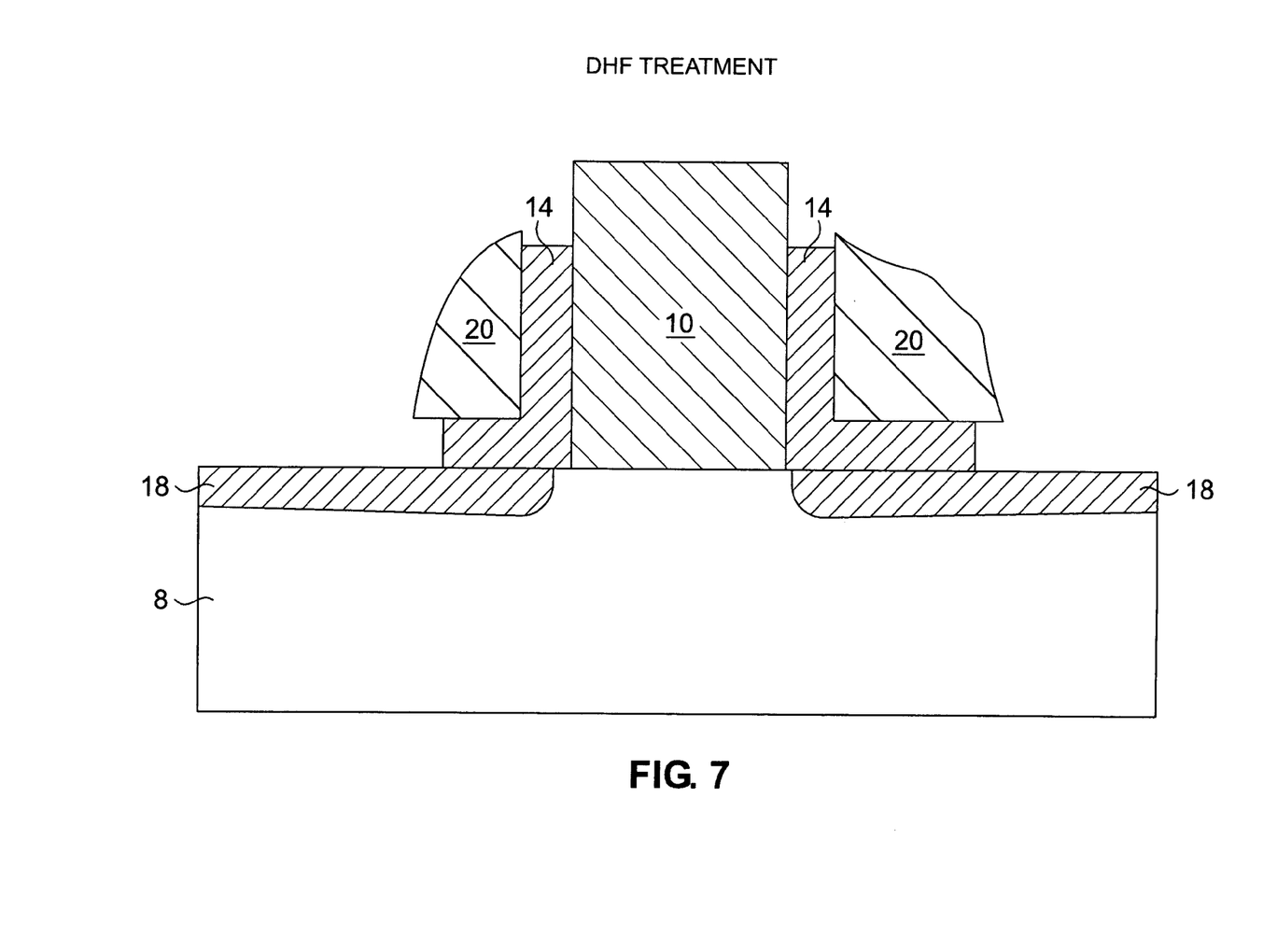

In FIG. 4 a nitride mask layer 20 such as silicon nitride is then formed over the exposed surface of the structure. Next, in FIG. 5, an angled ion (e.g., Si or Ge) implant 22 is performed. The gate conductor 10 shields the nitride mask layer 20 and spacer 14 on the drain side (the right side in the figures) of the structure from damage by the angled ion implant 22. The angled ion implant is used to selectively damage the unprotected nitride layer 20 to subsequently fabricate an asymmetric nitride spacer that has a greater width on the drain side than on the source side (see the damaged portions 24 of nitride mask layer 20 in FIG. 6). The damaged portions 24 of nitride layer 20 can be subsequently removed selectively by a wet etch process using an etchant such as a diluted hydrofluoric acid solution The resulting structure after the damaged nitride portions 22 are removed is shown in FIG. 7.

Figure 8:
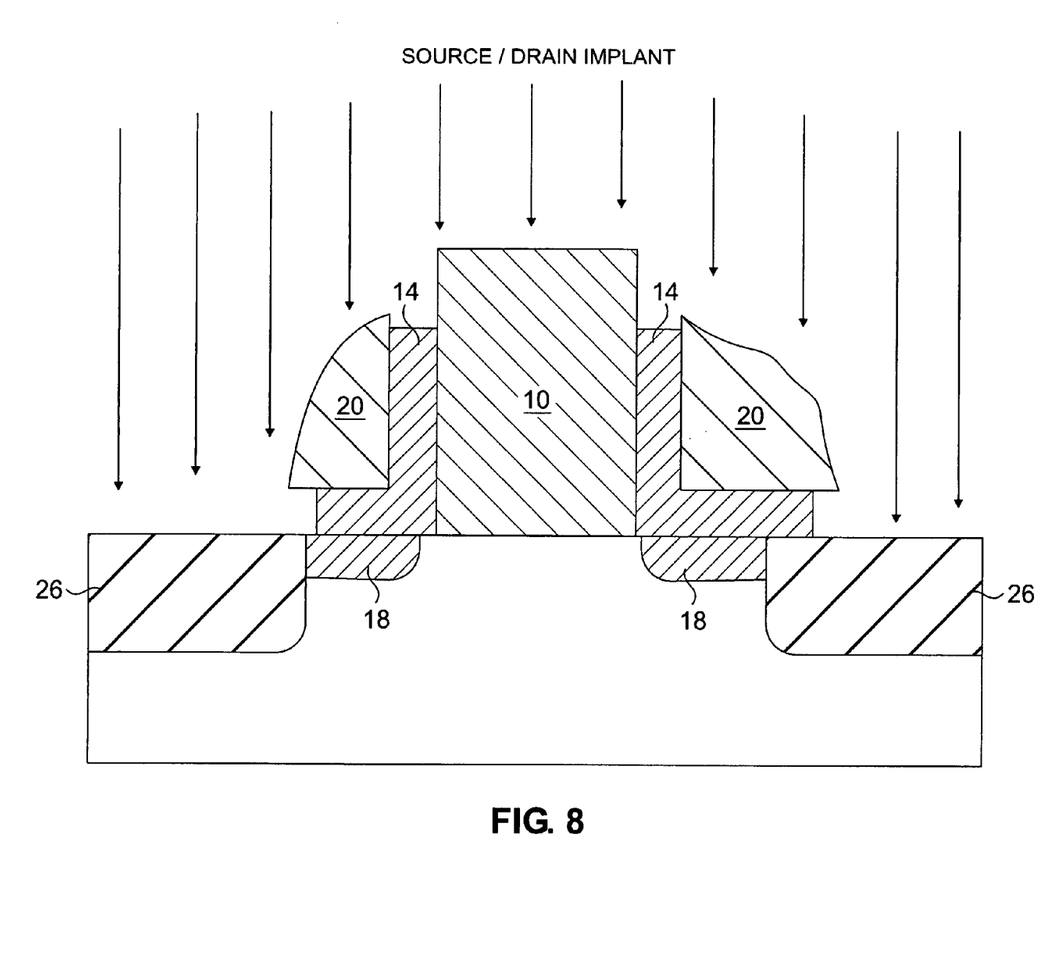
Figure 9:
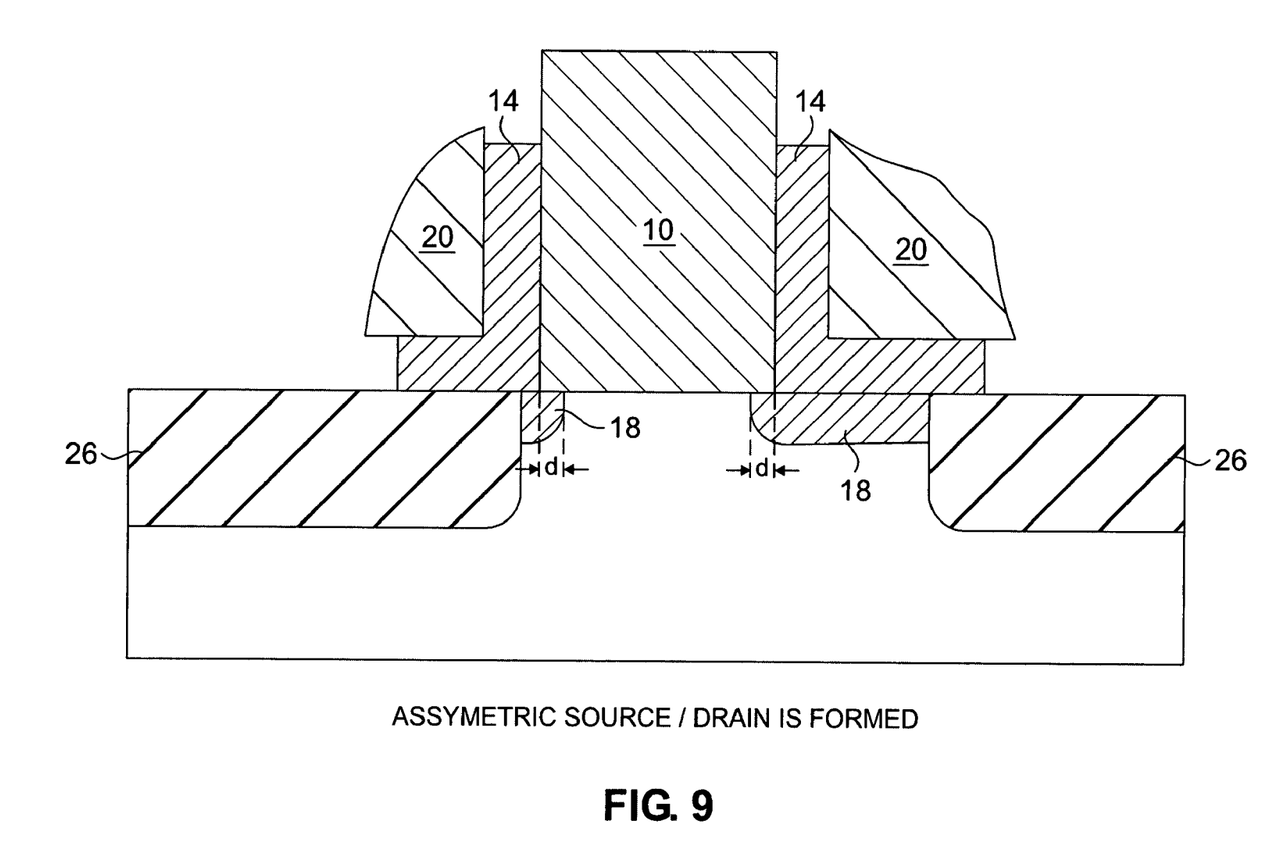

An implantation step is performed in FIG. 8 to form deeper implanted source and drain regions 26 in those areas not protected by the gate 10, oxide spacer 14 and nitride layer 20. Of course, the implanted ions have the same conductivity as the dopant implanted into extensions 18. The implantation step is followed by an activation anneal step in which the formation of the source and drain regions are completed so that source and drain extensions 18 overlap with the gate 10 (see FIG. 9). As shown, because the nitride mask layer 20 is wider on the drain side than on the source side, the source and drain implantation step implants ions over a greater portion of extension 18 on the source side than on the drain side. That is, the width of the deeper drain region 26 is greater on the source side than on the drain side. Conversely, as evident in FIG. 9, the width of the extension 18 on the source side is less than the width of the extension 18 on the drain side. It should be noted, however, that in contrast to the device shown in U.S. Pat. No. 6,746,924, in the present invention the overlap between the extensions 18 and gate 10 (indicated in FIG. 9 by the distance "d") is the same on both the source side and the drain side.

Figure 10:
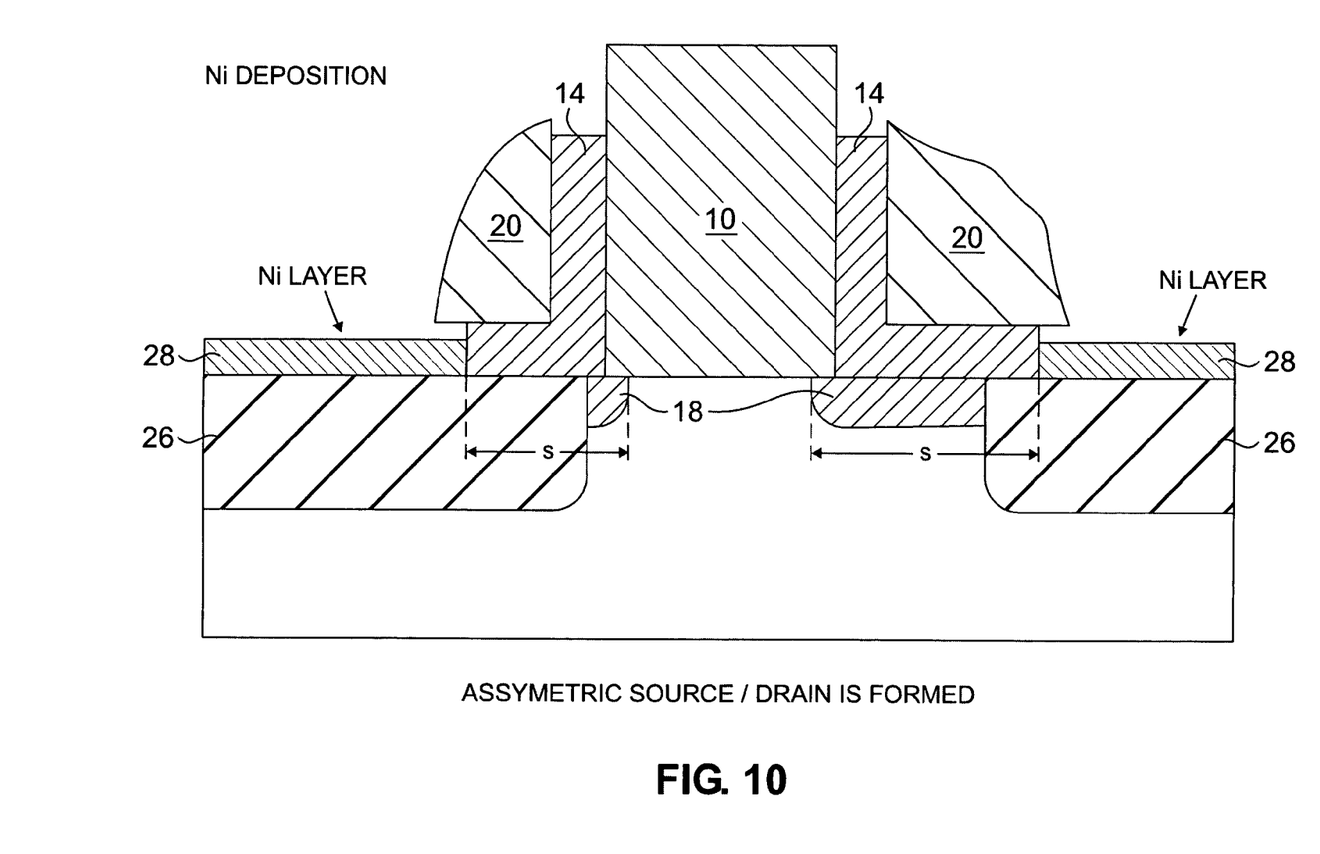

After formation of the deeper source and drain regions 26 and the subsequent anneal, a silicide layer 28 is formed by the deposition of a conductive metal over the exposed silicon on the source and drain sides. The device is then heat treated at an elevated temperature for a time period sufficient to form the electrically conductive silicide layer 28. During heat treating, metal atoms diffuse into the underlying source and drain regions 26 and silicon atoms from the source and drain regions 26 diffuse into the metal to form the silicide 28. The conductive metal used for the silicide 22 may comprise any suitable conductive metal such as nickel, titanium, tungsten, or molybdenum for example. The silicide 28 is formed to reduce the sheet resistance of the source and drain contacts (not shown), which are formed by conventional means to complete the MOSFET structure. Finally, the device is completed in accordance with processes well known in the art such as metalization, for example, to provide appropriate contacts, passivation layers and the like.

In the resulting structure shown in FIG. 10 the distance "s" between the edge of the silicide and the junction (i.e., the remote end of the extension 18 that overlaps with the gate 10), is less on the source side than on the drain side. This distance contributes to the deep source and deep drain resistances and the source and drain extension resistances of the devices's parasitic resistance. Accordingly, the present invention provides a MOSFET device in which the parasitic resistance on the source side is correspondingly less than on the drain side.

Although various embodiments are specifically illustrated and described herein, it will be appreciated that modifications and variations of the present Invention are covered by the above teachings and are within the purview of the appended claims without departing from the spirit and intended scope of the invention. For example, the method of the present invention may be used to form a MOSFET in which the conductivities of the various semiconductor regions are reversed from those described herein.

What is claimed is:

1. A method of fabricating a MOSFET device, comprising:

forming a semiconductor device having a substrate on which a gate conductor having sidewalls separates a source region and a drain region, and having an oxide layer formed over the gate sidewalls and a portion of the substrate;

implanting ions of a first conductivity into the source and the drain regions to define source and drain extensions that respectively extend in part under the gate conductor;

forming a nitride layer over the oxide layer that extends over said portion of the substrate;

performing an angled ion implant during which the gate conductor shields a portion of the nitride layer over at least a portion of the drain region from damage by the angled ion implant, such that the angled ion implant selectively damages portions of the nitride layer in which ions are implanted to form damaged portions of the nitride layer;

removing the damaged portions of the nitride layer while leaving undamaged portions of the nitride layer as a nitride mask to protect at least a portion of the source and drain extensions from a subsequent dopant implant;

implanting ions of the first conductivity type into the source region and the drain region while using the undamaged portions of the nitride layer as a mask to form deep source and deep drain regions, respectively; and forming a conductive layer over exposed portions of the deep source region and the deep drain region such that a lateral distance between an edge of the conductive layer over the source region and an end of the source extension under the gate conductor is less than a lateral distance between an edge of the conductive layer over the drain region and an end of the drain extension under the gate conductor.

2. The method of claim 1 wherein, subsequent to the step of implanting ions to form the deep source and drain regions, an annealing step is performed so that portions of the source and the drain extensions extend under the oxide layer.

3. The method of claim 2 wherein the portions of the source and the drain extensions extending under the oxide layer are substantially equal in width.

4. The method of claim 1 wherein the gate conductor comprises polysilicon.

5. The method of claim 1 wherein the step of removing the damaged portions of the nitride layer is performed with a wet etch process.

6. The method of claim 1 wherein the angled ion implant step is performed with silicon ions.

7. The method of claim 1 wherein the angled ion implant step is performed with germanium ions.

8. The method of claim 1 wherein the substrate comprises a silicon substrate.

9. The method of claim 1 wherein the substrate comprises a silicon-on-insolator (SOI) substrate.

10. The method of claim 1 wherein the step of implanting ions of a first conductivity into the source and the drain regions comprises a halo implantation step.

11. A MOSFET device constructed in accordance with claim 1.

* * * * *

UNITED STATES PATENT AND TRADEMARK OFFICE
CERTIFICATE OF CORRECTION

PATENT NO.      : 6,982,216 B1
APPLICATION NO. : 10/976098
DATED           : January 3, 2006
INVENTOR(S)     : Tenko Yamashita

It is certified that error appears in the above-identified patent and that said Letters Patent is hereby corrected as shown below:

Col. 3, line 27, before "offset", change "from", to - - form - -.

Col. 2, line 33, after last word "layer", insert - - . - -.

Signed and Sealed this

First Day of August, 2006

JON W. DUDAS
*Director of the United States Patent and Trademark Office*